United States Patent
Schulze et al.

(10) Patent No.: US 9,219,143 B2
(45) Date of Patent: Dec. 22, 2015

(54) SEMICONDUCTOR DEVICE AND SUPER JUNCTION SEMICONDUCTOR DEVICE HAVING SEMICONDUCTOR MESAS

(71) Applicant: Infineon Technologies Austria AG, Villach (AT)

(72) Inventors: Hans-Joachim Schulze, Taufkirchen (DE); Peter Irsigler, Obemberg am Inn (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/789,552

(22) Filed: Jul. 1, 2015

(65) Prior Publication Data
US 2015/0303298 A1 Oct. 22, 2015

Related U.S. Application Data

(63) Continuation of application No. 14/096,319, filed on Dec. 4, 2013, now Pat. No. 9,105,717.

(51) Int. Cl.
| | |
|---|---|
| *H01L 29/66* | (2006.01) |
| *H01L 29/78* | (2006.01) |
| *H01L 29/06* | (2006.01) |
| *H01L 21/3063* | (2006.01) |
| *H01L 21/306* | (2006.01) |
| *H01L 21/265* | (2006.01) |
| *H01L 21/324* | (2006.01) |
| *H01L 29/732* | (2006.01) |

(52) U.S. Cl.
CPC .......... *H01L 29/7811* (2013.01); *H01L 21/265* (2013.01); *H01L 21/3063* (2013.01); *H01L 21/30604* (2013.01); *H01L 21/324* (2013.01); *H01L 29/0634* (2013.01); *H01L 29/0646* (2013.01); *H01L 29/0692* (2013.01); *H01L 29/66272* (2013.01); *H01L 29/66712* (2013.01); *H01L 29/732* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 6,566,201 B1 * | 5/2003 | Blanchard | 438/268 |
| 8,367,532 B2 | 2/2013 | Mauder et al. | |
| 8,421,196 B2 | 4/2013 | Weber et al. | |
| 2003/0011039 A1 | 1/2003 | Ahlers et al. | |
| 2003/0160302 A1 | 8/2003 | Sankin et al. | |
| 2013/0146894 A1 | 6/2013 | Cheng et al. | |

FOREIGN PATENT DOCUMENTS

WO 2007085387 A1 8/2007

* cited by examiner

*Primary Examiner* — Kyoung Lee
(74) *Attorney, Agent, or Firm* — Murphy, Bilak & Homiller, PLLC

(57) ABSTRACT

A semiconductor device includes semiconductor mesas of a first conductivity type extending between a first surface and a bottom plane of a semiconductor portion, and a semiconductor structure of a second, complementary conductivity type extending along sidewalls of the semiconductor mesas and outwardly from the semiconductor mesas. A thickness of the semiconductor structure has a local maximum value at a first distance to both the first surface and the bottom plane.

9 Claims, 14 Drawing Sheets

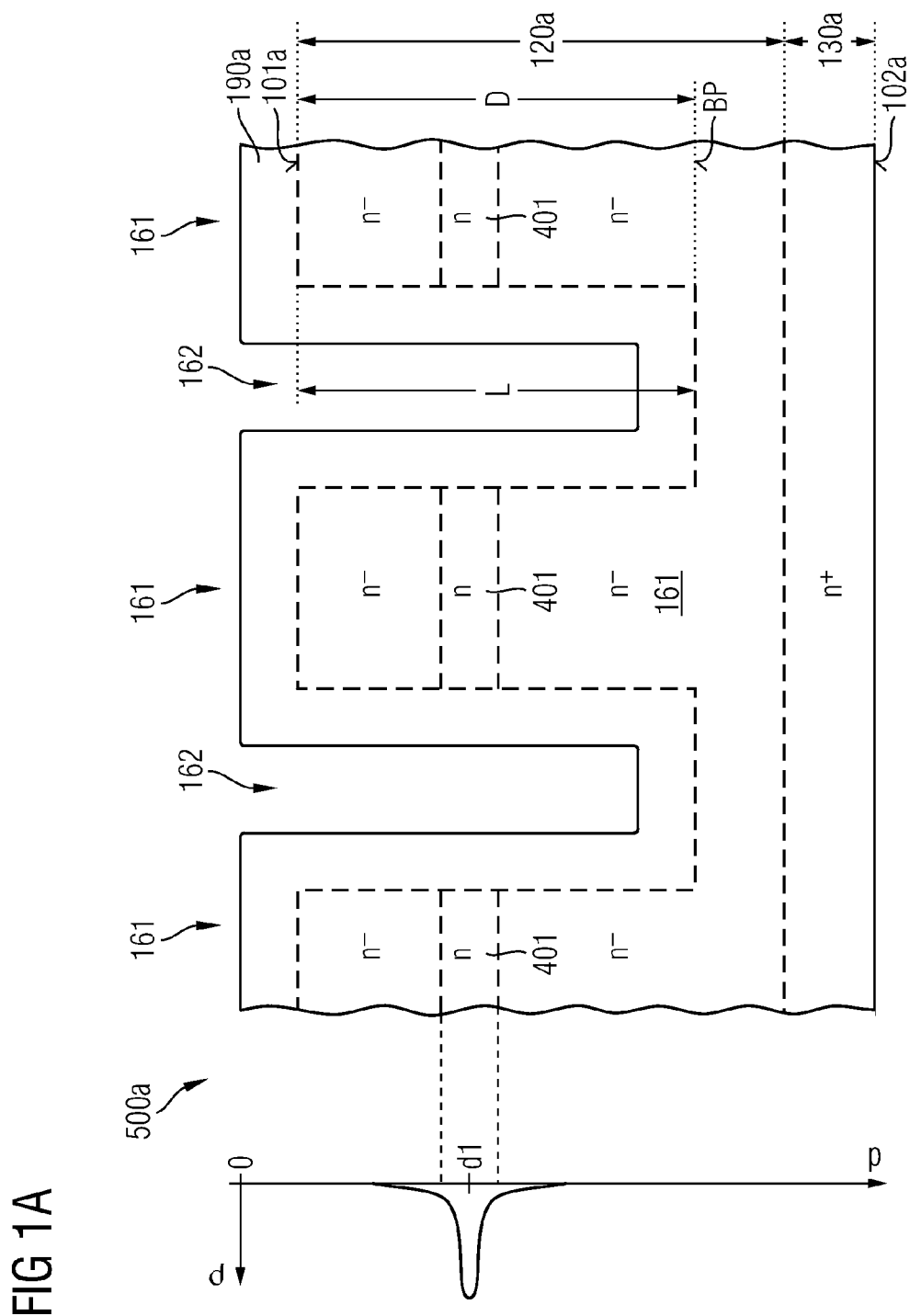

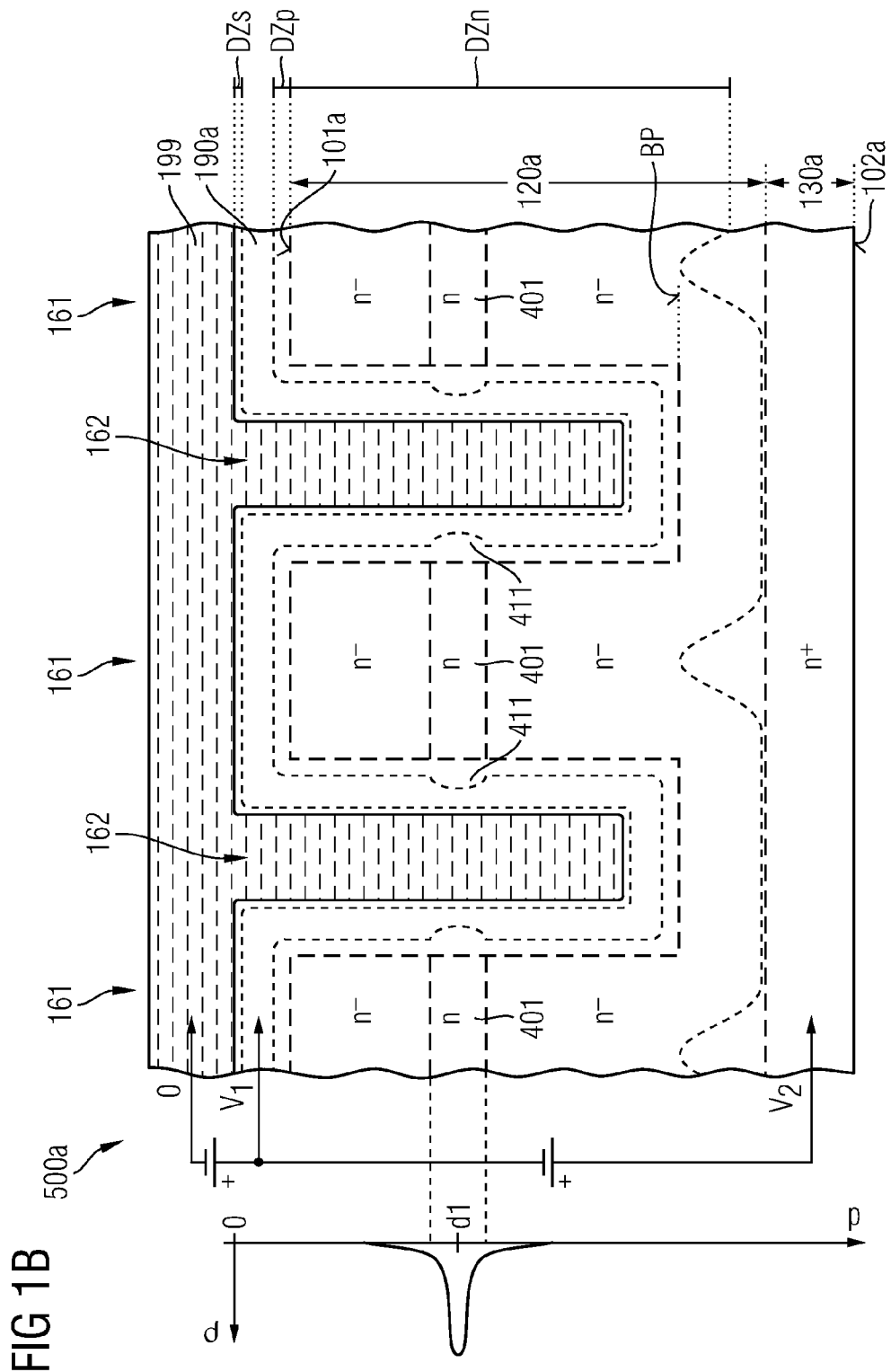

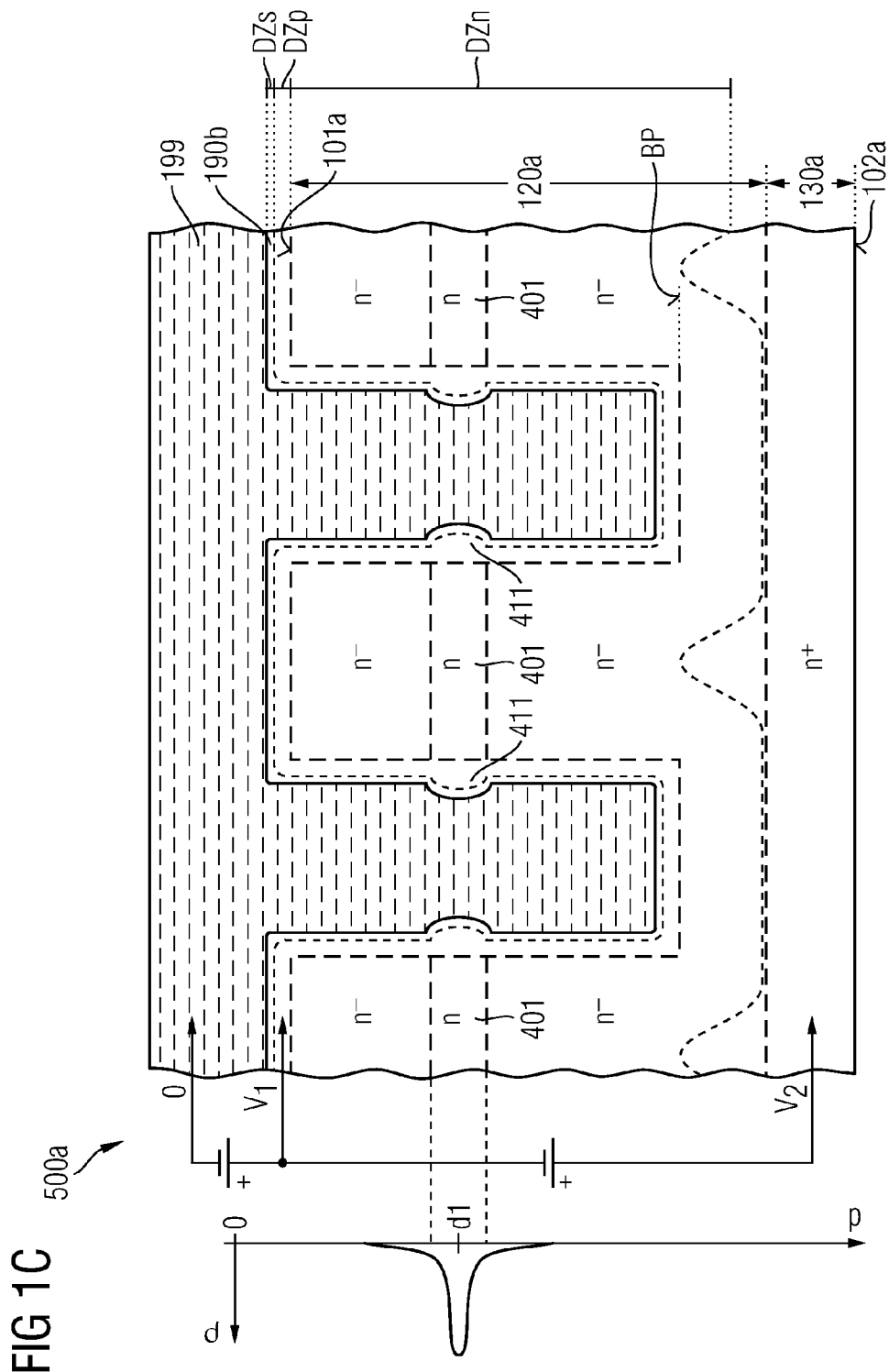

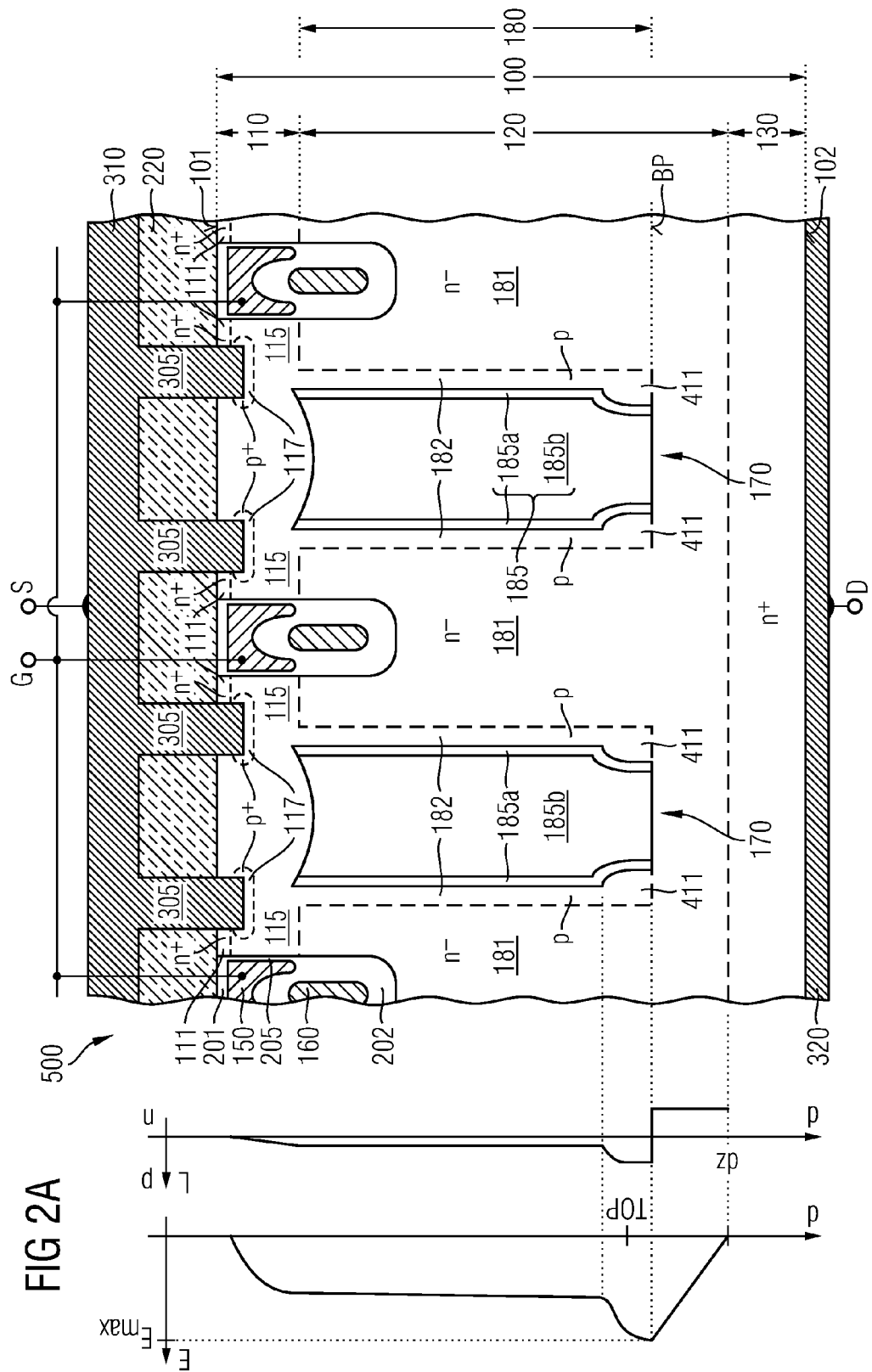

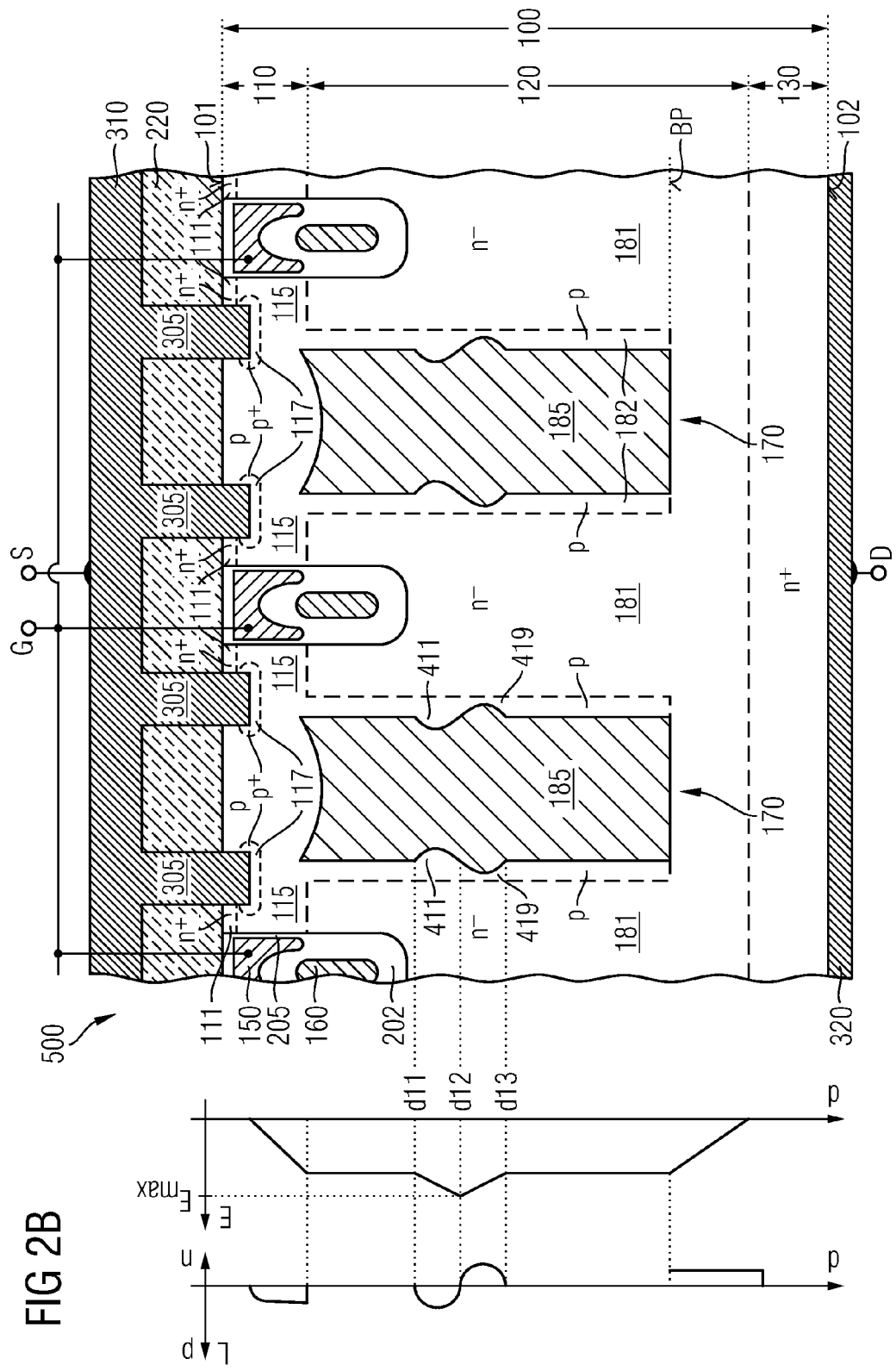

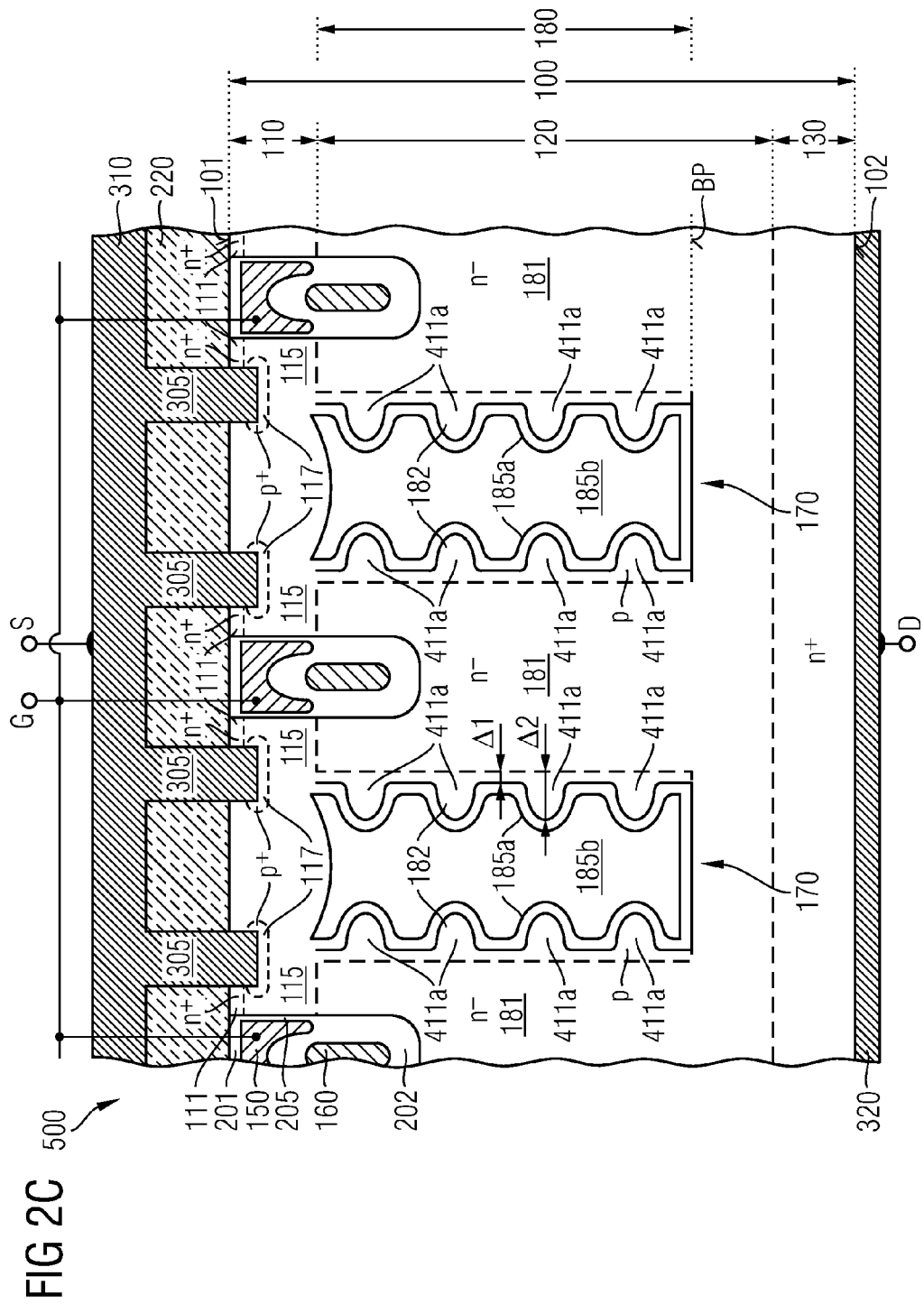

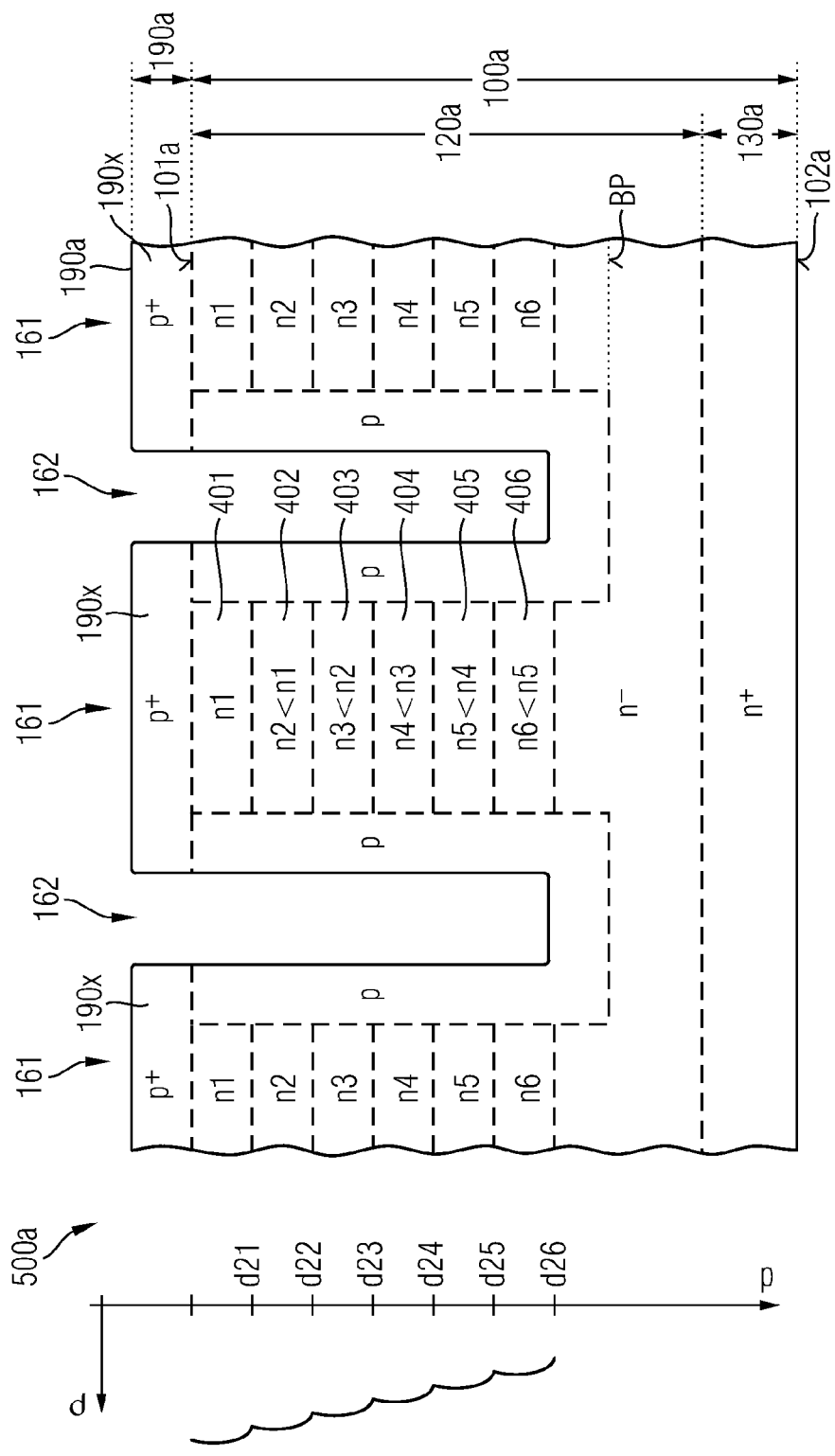

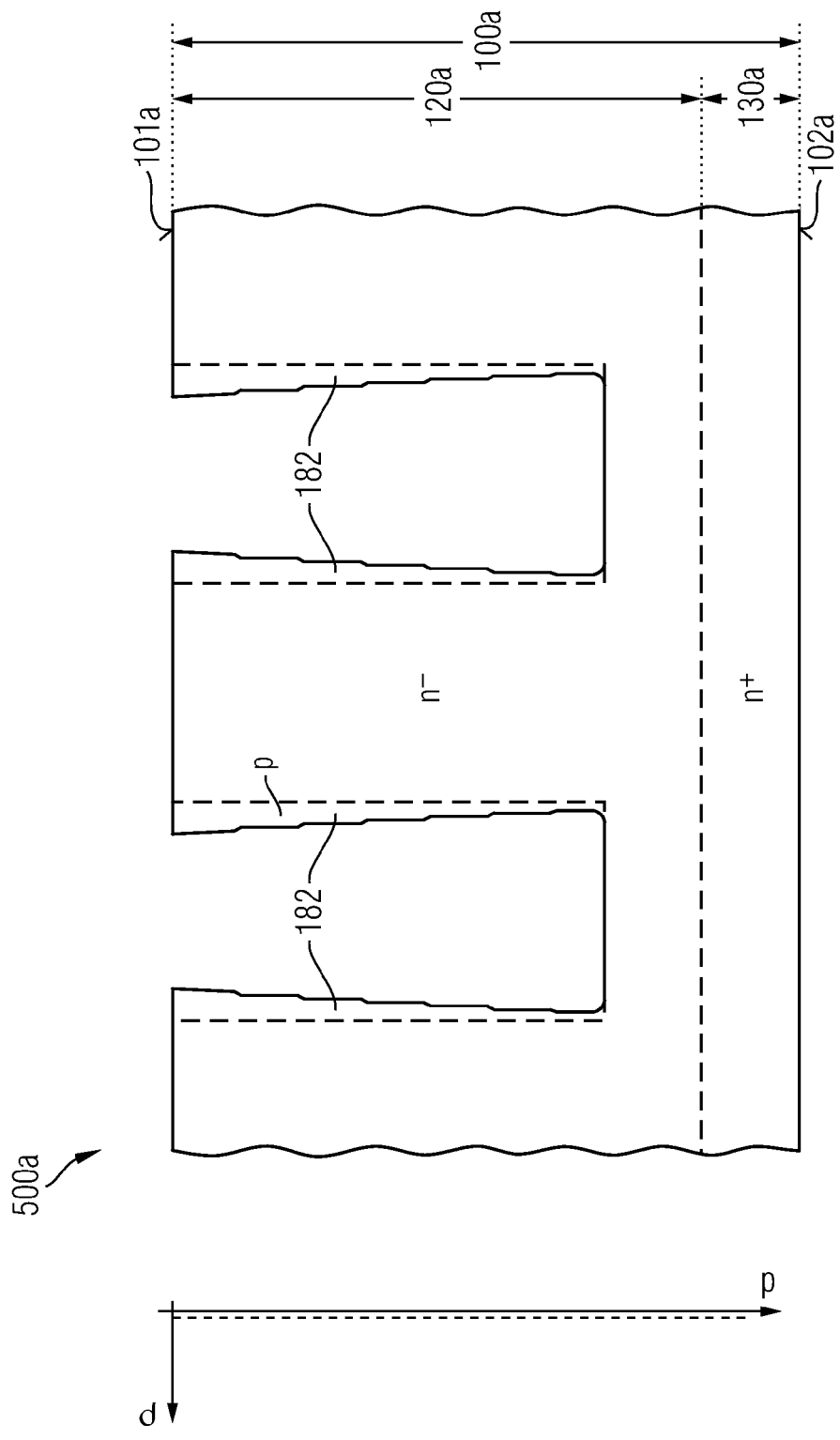

SEMICONDUCTOR DEVICE AND SUPER JUNCTION SEMICONDUCTOR DEVICE HAVING SEMICONDUCTOR MESAS

BACKGROUND

Semiconductor manufacturing provides lithography processes for patterning mechanical and electronic elements along two lateral directions of a main surface along which the mechanical and/or electronic elements are formed on a semiconductor wafer. Semiconductor devices like MEMS (micro electromechanical systems) and state of the art integrated circuits like Power MOSFETs (Power metal oxide semiconductor field effect transistors) are further based on patterning processes effective for shaping mechanical or electronic structures along a dimension vertical to the main surface. Conventional patterning processes which are effective in the vertical dimension make use of anisotropic deposition processes, depletion of precursors in trenches in a gaseous process environment and shadowing effects in case of tilted ion beam etching or tilted implants, by way of example. Conventional vertical patterning processes are either typically constricted to certain process materials/topologies or are difficult to control across a complete wafer surface or among the wafers of a wafer lot. There is a need for precise vertical patterning methods.

SUMMARY

An embodiment refers to a method of manufacturing a semiconductor device. A trench is formed in a semiconductor substrate between mesas of a first conductivity type. The trench extends from a process surface down to a bottom plane. A semiconductor layer of a second, complementary conductivity type is formed on sidewalls of the trench. At least in the mesas a vertical impurity concentration profile vertical to the process surface is non-constant between the process surface and the bottom plane. Thereafter, a portion of the semiconductor layer in the trench is removed by electrochemical etching.

According to another embodiment, a semiconductor device includes semiconductor mesas of a first conductivity type extending between a first surface and a bottom plane of a semiconductor portion. A semiconductor structure of a second, complementary conductivity type extends along sidewalls of the semiconductor mesas, wherein a thickness of the semiconductor structure has a local maximum value at a first distance to both the first surface and the bottom plane depth.

According to further embodiment, a super junction semiconductor device includes a semiconductor portion that includes a subsurface structure extending from a first surface of the semiconductor portion between mesas down to a bottom plane. The mesas have a first conductivity type and the subsurface structure comprises semiconductor structures of a second, complementary conductivity type extending along sidewalls of the mesas. The thickness of the semiconductor structures has a local maximum at a first distance to the first surface, the first distance being smaller than a distance between the first surface and the bottom plane.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

FIG. 1A is a schematic cross-sectional view of a portion of a semiconductor substrate for illustrating a method of manufacturing a semiconductor device in accordance with an embodiment providing a vertical semiconductor structure with a bulge after providing mesas with a non-constant vertical impurity concentration profile.

FIG. 1B shows the semiconductor substrate portion of FIG. 1A at the beginning of an electrochemical etching.

FIG. 1C shows the semiconductor substrate portion of FIG. 1B after the electrochemical etching.

FIG. 2A is a schematic cross-sectional view of a portion of a semiconductor device in accordance with an embodiment providing a vertical semiconductor structure with a single bulge.

FIG. 2B is a schematic cross-sectional view of a portion of a semiconductor device in accordance with an embodiment providing a vertical semiconductor structure with a bulge and a notch.

FIG. 2C is a schematic cross-sectional view of a portion of a semiconductor device in accordance with an embodiment providing a vertical semiconductor structure with connected half-bubbles.

FIG. 3A is a schematic cross-sectional view of a portion of a semiconductor substrate for illustrating a method of manufacturing a semiconductor device in accordance with an embodiment providing a vertical semiconductor structure whose thickness increases with increasing distance to a first surface before electrochemical etching.

FIG. 3C is a schematic cross-sectional view of the semiconductor substrate portion of FIG. 3B after removing an etching solution used during the electrochemical etching.

DETAILED DESCRIPTION

Figure 1D:
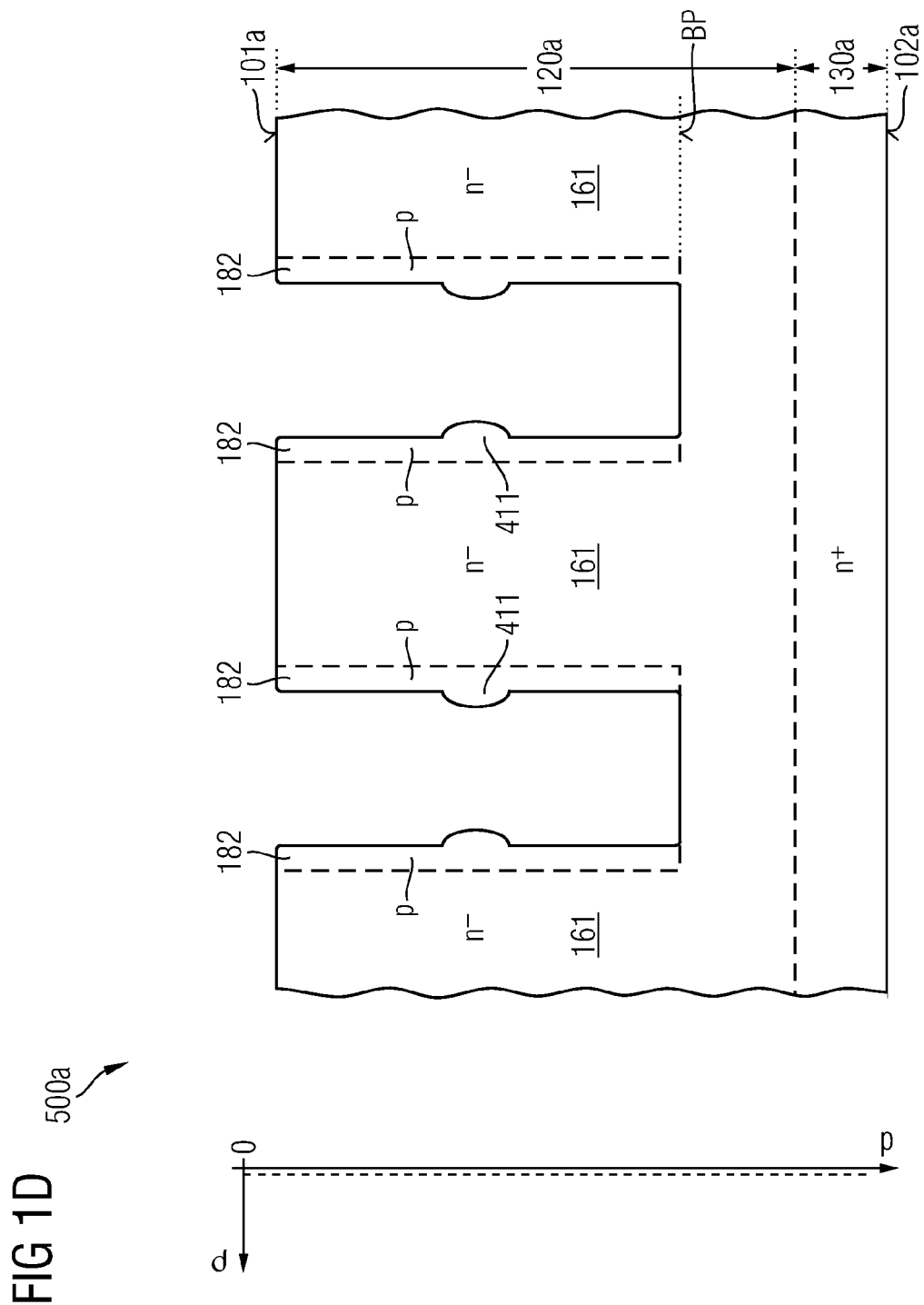
FIG. 1D shows the semiconductor substrate portion of FIG. 1C after removing horizontal portions of an etched semiconductor layer.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration that is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D refer to a vertical patterning process. In a semiconductor substrate 500a trenches 162 extend from a process surface 101a of the semiconductor substrate 500a down to a bottom plane BP at a distance D to the process surface 101a.

The semiconductor substrate 500a may include a pedestal layer 130a provided from a single-crystalline semiconductor material of a first conductivity type. The single-crystalline semiconductor material may be silicon Si, silicon carbide SiC, germanium Ge, a silicon germanium crystal SiGe, gallium nitride GaN or gallium arsenide GaAs, by way of example.

A main epitaxial layer 120a may be grown by epitaxy on the pedestal layer 130a. The main epitaxial layer 120a may be provided from the same semiconductor material as the pedestal layer 130a and may be in-situ doped with a homogeneous background impurity concentration of the first conductivity type. An exposed surface of the main epitaxial layer 120a opposite to the pedestal layer 130 forms the process surface 101a and an opposite surface of the pedestal layer 130a a rear side surface 102a. A distance between the process surface 101a and the second surface 102 may be at least 20 μm, e.g. at least 40 μm.

The trenches 162 may be formed by RIE (reactive ion etching) and may have vertical sidewalls perpendicular to the process surface 101a or may taper with increasing distance to the process surface 101a.

At least one of the trenches 162 has a vertical extension L and extends between the process surface 101a and the bottom plane BP. The trenches 162 may be stripes or hole trenches whose lateral cross-sectional areas may be circles, ellipses, ovals or rectangles with or without rounded corners, for example squares. Portions of the semiconductor substrate 500a between the trenches 162 form mesas 161. Other embodiments may provide one single trench, for example a trench surrounding an inner portion of the semiconductor substrate 500a or a plurality of trenches arranged along a line surrounding the inner portion of the semiconductor substrate 500a.

A semiconductor layer 190a of a second conductivity type, which is the opposite of the first conductivity type, extends at least along sidewalls of the trenches 162. In the illustrated embodiment the semiconductor layer 190a covers sidewalls and top surfaces of the mesas 161 as well as the trench bottoms. The semiconductor layer 190a may be deposited in an LPCVD (low pressure chemical wafer deposition) process or as an in-situ doped epitaxial layer. According to another embodiment, p-type impurities are introduced into the mesas 161 by outdiffusion from a gaseous phase or from a sacrificial layer containing the p-type impurities.

A heavily doped contact region of the second conductivity type may be formed in a horizontal portion of the semiconductor layer 190a outside the trenches 162 or, in absence of such horizontal portion, in the top surface of the mesas 161.

In the mesas 161 a vertical impurity concentration profile orthogonal to the process surface 101a has a non-constant gradient. For example, the vertical impurity concentration decreases or increases with increasing distance to the process surface 101a, wherein a difference between a minimum and maximum value is at least 10%, e.g. at least 100%, of the minimum value. According to other embodiments, the vertical impurity concentration profile has at least one local minimum or maximum value in a distance to both the process surface 101a and the bottom plane BP, wherein the maximum value is at least twice the minimum value, e.g., at least ten times as high as the minimum value. For example the vertical impurity concentration profile has two or more local maximum or/and local minimum values.

The vertical impurity concentration profile may be defined by suitable in-situ doping during epitaxial growth of the main epitaxial layer 120a. According to other embodiments, the vertical impurity concentration profile may be defined through implants through the process surface 101a or the rear side surface 102a before or after forming the semiconductor layer 190a combined with tempering processes for controlling activation and diffusion of the implanted impurities.

The first conductivity type of the semiconductor mesas 161 may be the p-type and the second conductivity type of the semiconductor layer 190a may be the n-type. According to the illustrated embodiment the first conductivity type of the mesas 161 is the n-type and the second conductivity type of the semiconductor layer 190a is the p-type.

According to an embodiment protons are implanted into the mesas 161 through the process surface 101a or through the rear side surface 102a, for example after providing the semiconductor layer 190a. The implanted protons may be tempered at temperatures between 300 and 500 degree Celsius, wherein the implanted protons are trapped in complexes at crystal lattice vacancies induced through the implant resulting in the formation of complexes acting as donors. Temperature and duration of the tempering adjust the vertical extension of an impurity zone 401 in the semiconductor mesas 161, in other words a vertical proton-induced donor profile.

FIG. 1A shows the mesas 161 with the impurity zones 401 having a maximum impurity concentration value at a first distance d1 and a p-type semiconductor layer 190a including portions extending along the mesa sidewalls.

An etching solution 199, which is an alkaline solution, is applied on the side of the semiconductor substrate 500a with the process surface 101a such that the etching solution 199 is in direct contact with the semiconductor layer 190a. For etching silicon, the etching solution 199 may contain potassium hydroxid KOH or tetra-methyl ammonium hydroxid TMAH, by way of example.

A voltage is applied between the etching solution 199 and the pedestal layer 130a. Additionally a forward voltage may be applied between the etching solution 199 and the semiconductor layer 190a. The applied total voltage divides into a first voltage V1 between the p-type semiconductor layer 190a and the etching solution 199 and a second voltage V2 between the p-doped semiconductor layer 190a and the n-doped pedestal layer 130a.

In the illustrated embodiment a junction between the etching solution 199 and the p-type semiconductor layer 190a is effective as a Schottky barrier such that the voltage V1 builds up a Schottky depletion region DZs in a portion of the semiconductor layer 190a along the interface with the etching solution 199. Other embodiments providing a heavily p-doped contact region in the semiconductor layer 190a may decrease the Schottky barrier. The second voltage V2 reverse biases the pn junction between the p-doped semiconductor layer 190a and the n-type main epitaxial layer 120a such that a pn depletion zone is formed along the interface between the semiconductor layer 190a and the mesas 161. The second voltage V2 may be selected such that a first portion DZn of the pn depletion zone in the n-type body region 100a fully depletes at least the mesas 161, for example the mesas 161 and sections of the main epitaxial layer 120a between the bottom plane BP and the pedestal layer 130a. According to another embodiment the second voltage V2 may be selected such that the mesas 161 are not fully depleted.

Thickness of and impurity concentration in the semiconductor layer 190a are selected such that for fully depleted mesas 161 a second portion DZp of the pn depletion zone does not extend through the complete semiconductor layer 190a or, in presence of a Schottky depletion zone DZs, up to the Schottky depletion zone DZs. Since the extension of the second portion DZp of the pn junction depletion zone depends on the impurity concentration on both sides of the pn junction, the second portion DZp of the pn junction depletion zone is wider in a portion of the semiconductor layer 190a opposing the impurity zone 401 at the same distance to the process surface 101a.

FIG. 1B shows the first portion DZn of the pn junction depletion zone fully depleting the mesas 161 as well as portions of the main epitaxial layer 120a between the bottom plane BP and the pedestal layer 130a. The second portion DZp of the pn junction depletion zone includes bulges 411 imaging the peak in the vertical impurity concentration profile in the mesas 161 at the first distance d1.

The etching solution 199 recesses the semiconductor layer 190a by solving negatively charged silicon at the surface of the semiconductor layer 190a. With decreasing thickness of the recessed semiconductor layer 190b the distance between the Schottky depletion zone DZs and the second portion DZp of the pn junction depletion zone gradually decreases. Where the Schottky depletion zone DZs reaches the pn depletion zone, electrons present on the surface of the recessed semiconductor layer 190b are drained off to the anode potential of the applied blocking voltage. Where electrons are drained off from the surface of the recessed semiconductor layer 190b, the silicon atom aggregates remain without charge and the process of solving silicon stops. As a consequence, the etch process is self-adjusted in the way that the etch stops as soon as the Schottky depletion zone DZs merges with the second portion DZp of the pn depletion zone.

FIG. 1C shows the semiconductor substrate 500a after the etching process has finished. The thickness of the recessed semiconductor layer 190b is given by the sum of the profiles of the Schottky depletion zone DZs and the second portion DZp of the pn junction depletion zone wherein the latter is modulated by the vertical impurity concentration profile in the mesas 161.

In case the impurity zones 401 have been provided by a proton implant a further temper process at temperatures above 550 degree Celsius may follow to deactivate (anneal-out) the proton-induced donors so that the original doping profile, which was implemented prior to the proton implantation, is restored. An anisotropic etch may remove horizontal portions of the recessed semiconductor layer 190b.

FIG. 1D shows the semiconductor substrate 500a after deactivating the proton-induced donors. Remnants of the recessed semiconductor layer 190b of FIG. 1C form a vertical semiconductor structure 182. The thickness of the semiconductor structure 182 is modulated along the vertical dimension and is irrespective of the final vertical impurity concentration profile in the mesas 161. Since the etching process is self-aligned to the extension of the pn junction depletion zone which in turn can be precisely defined through the well-controllable vertical impurity concentration gradient in the mesas 161, the thickness of the semiconductor structure 182 can be precisely defined and adjusted to application requirements by the selection of the one or several proton irradiation energies, proton irradiation doses as well as annealing temperature and annealing time. Instead of one or more bulges 411, the vertical semiconductor structure 182 may include notches. Other embodiments may provide semiconductor structures 182 whose thickness strictly or monotonously decreases or strictly or monotonously increases with increasing distance to the process surface 101a.

The method may be used for modulating the electric field distribution in super junction devices or in vertical IGFETs (insulated gate field effect transistors), for example in vertical IGFETs with field plates. Other embodiments may provide the method for modulating the electric field in edge termination structures or for locally compensating surface charges. Further embodiments may concern electronic devices whose parameters depend on an interface area between a first component of a semiconductor material and a second component, which may be provided from a semiconductor material or a conductive material, for example the interface area between basis and emitter regions of a BJT (bipolar junction transistor).

FIG. 2A shows a super junction semiconductor device 500 which may be manufactured using the method as illustrated in FIGS. 1A to 1D.

The semiconductor device 500 is based on a semiconductor portion 100 with a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 mainly depends on a blocking voltage the semiconductor device 500 is designed to absorb in a blocking mode. The distance may be at least 20 µm, for example at least 40 µm. The semiconductor portion 100 may have a rectangular shape with an edge length in the range of several millimeters or a circular shape with a diameter of several millimeters or centimeters. The normal to the first and second surfaces 101, 102 defines a vertical direction and directions orthogonal to the normal direction are lateral directions.

The semiconductor portion 100 may include a pedestal layer 130 of a first conductivity type which may extend along a complete cross-sectional plane of the semiconductor portion 100 parallel to the second surface 102. In case the semiconductor device 500 is an IGFET, the pedestal layer 130 directly adjoins the second surface 102 and may have a comparatively high impurity concentration of at least $1\times10^{18}$ $cm^{-3}$, by way of example. In case the semiconductor device 500 is an IGBT (insulated gate bipolar transistor) a collector layer of a second conductivity type, which is the opposite of the first conductivity type, is arranged between the pedestal layer 130 and the second surface 102, wherein the impurity concentration in the pedestal layer 130 is between $1\times10^{14}$ $cm^{-3}$ and $5\times10^{15}$ $cm^{-3}$, by way of example.

The semiconductor portion 100 further includes a drift layer 120 directly adjoining the pedestal layer 130. The drift layer 120 has a background impurity concentration of the first conductivity type, which is lower than the impurity concentration in the pedestal layer 130 by a factor of ten or more, and includes a super junction structure 180, which may be spaced from the pedestal layer 130. The drift layer 120 may further include a field stop layer and/or a buffer layer adjoining the pedestal layer, respectively.

The super junction structure 180 includes weakly doped mesa areas 181 of a first conductivity type formed between subsurface structures 170 as well as vertical semiconductor structures 182 of a second conductivity type complementary to the first conductivity type, wherein the semiconductor structures 182 extend along sidewalls of the mesa areas 181.

A surface layer 110 of the semiconductor portion 100 between the first surface 101 and the drift layer 120 is at least partly formed from a semiconductor material and includes source regions 111 of the first conductivity type along the first surface 101 and body regions 115 of the second conductivity type separating the source regions 111 and the drift layer 120. The body zones 115 may be structurally and electrically connected with the semiconductor structures 182. The surface layer 110 may be formed by epitaxy on the mesa areas 181 and may or may not cover the subsurface structures 170.

Field effect transistor cells for controlling a current flow between the first surface 101 and the second surface 102 through the semiconductor portion 100 in response to a signal applied to a gate terminal G are formed in the surface layer 110 and may extend into the drift layer 120. The field effect transistor cells may be lateral or vertical field effect transistor cells which may be arranged in the vertical projection of the subsurface structures 190 or in the vertical projection of the mesa areas 181.

According to the illustrated embodiment vertical IGFET cells are provided in the vertical projection of the mesa areas 181. Gate electrodes 150 electrically coupled to or connected with the gate terminal G are formed in gate trenches that may extend from the first surface 101 into the mesa areas 181. For each IGFET cell, a first dielectric 201 separates the gate electrode 150 from the source zones 111 which extend from the first surface 101 along the gate trench into the surface layer 110. A field dielectric 202 separates a field electrode 160 arranged in the gate trench between the gate electrode 150 and the second surface 102 from the gate electrode 150 and the surrounding semiconductor material of the semiconductor portion 100. A gate dielectric 205 dielectrically insulates the gate electrode 150 from the body region 115.

A dielectric structure 220 may directly adjoin the first surface 101. The dielectric structure 220 may include one or more dielectric layers from silicon oxide, silicon nitride, silicon oxynitride, doped silicon glass or undoped silicon glass, by way of example.

A first load electrode 310 is provided on the side of the first surface 101. Contact structures 305 extend through openings in the dielectric structure 220 and electrically connect the first load electrode 310 with the source zones 111 and the body regions 115. Heavily doped contact regions 117 of the second conductivity type may directly adjoin the contact structures 305 and the body regions 115 for providing a low-ohmic connection of the body regions 115. The first load electrode 310 may form or may be electrically connected or electrically coupled to a source terminal S of the semiconductor device 500.

A second load electrode 320 directly adjoins the second surface 102 and may form or may be electrically connected or coupled to a drain terminal D.

In the subsurface structures 170 a fill structure 185 separates two opposing semiconductor structures 182, respectively. The fill structure 185 may include a dielectric passivation liner 185a formed, e.g., by oxidizing isotropically the semiconductor structures 182 or by deposition. The fill structure 185 may further include a void 185b which is a vacuum or which is filled with a gaseous fluid.

The semiconductor structures 182 may correspond to the finalized vertical semiconductor structure 182 in FIG. 1D and may be formed as described with reference to FIGS. 1A to 1D, wherein the bulges 411 may be provided close to the bottom plane BP. Outside the bulges 411, the thickness of the semiconductor structure 182 may be uniform and in the range from 10 nm to at most 250 nm, by way of example. The portion of the semiconductor layer 182 assigned to the Schottky depletion zone DZs may be maintained completely or isotropically thinned such that the compensation structure 180 is slightly p-loaded or fully compensated.

The compensation rate for a vertical section of the compensation structure 180 may be defined by the difference between the quantity of impurities of the second conductivity type and the quantity of impurities of the first conductivity type related to the greater amount of both values.

For perfect compensation the quantities related to an arbitrary vertical section of the compensation structure 180 are equal and the compensation rate in this vertical section is equal 0. In a blocking mode of the semiconductor device, with increasing reverse voltage, depletion zones grow in the lateral direction until the mesa areas 181 are completely depleted from mobile charge carriers.

In the illustrated semiconductor device 500 impurities of the second conductivity type slightly overcompensate for impurities of the first conductivity type along the vertical extension of the compensation structure 180. As a result, after depletion of the super junction structure 180 from mobile charge carriers in the reverse mode, the stationary charges do not completely compensate each other and the electric field strength slightly increases with increasing distance to the first surface 101 as shown in the diagrams on the left hand side of FIG. 2A.

The bulges 411 at the trench bottom further increase the p-load and locally further increase the electric field strength, whereas the drift layer 120 is n-loaded between the bottom plane BP and the pedestal layer 130 such that the electric field strength sharply decreases. A pronounced electric field peak results close to the bottom plane BP. A peak range around the location of the maximum electric field strength at the bottom plane BP defines the area where mobile charge carriers are generated when an avalanche breakthrough has been triggered. The peak range may be tuned such that the electric field strength in the peak range is sufficiently high to generate charge carriers in case an avalanche effect has been triggered in the semiconductor device 500 and is sufficiently small to restrict the number of generated charge carriers to ensure that the voltage across the semiconductor device 500 does not immediately break down. The resulting electric field profile has a peak approximately at the trench bottom. Electrons and holes effect the field distribution both in the breakdown and in the avalanche case. Both types of charge carriers have a stabilizing effect, since both flow from the place of generation into areas in which they compensate for the predominating excess charge of the stationary charge carriers.

The diagrams on the left side of FIG. 2A show the charge load and the electric field profile in the semiconductor device 500 in case a reverse voltage is applied and no avalanche effect has been triggered. In substance, the electric field extends between the heavily doped pedestal layer 130 at a distance dz to the first surface 101 and the body zone 115. The electric field strength increases from both sides up to the bottom plane BP where the sign of the compensation rate changes and where the electric field strength reaches a maximum value Emax.

The slope of the electric field strength depends on the value of the compensation rate and is high where the compensation rate is high and low where the compensation rate is low. As a result, a peak area where the electric field strength is sufficiently high to generate mobile charge carriers in case an avalanche mechanism has been triggered is only small such that the number of generated charge carriers is limited and avalanche ruggedness is improved.

The semiconductor device 500 of FIG. 2B differs from the semiconductor device of FIG. 2A with respect to the fill structure of the subsurface structures 170 and with respect to the thickness modulation of the semiconductor structure 182. As regards further details reference is made to the description of FIG. 2A.

The subsurface structure 170 further includes a fill structure 185 of a fill material that separates the opposing semiconductor structures 182 of the subsurface structure 170. The fill material may be intrinsic or lightly-doped semiconductor material or a dielectric material. According to other embodiments, the fill structure 185 is a layered structure of two or more different materials.

The thickness of the semiconductor structures 182 is modulated such that the semiconductor structures 182 have a bulge between distances d11 and d12 to the first surface 101 and a notch between distances d12 and d13. The semiconductor structure 182 may be formed according to the method of FIGS. 1A to 1D with no proton-induced donors or a low proton-induced donor concentration in vertical sections of the mesas 181 between d12 and d13, with a high proton-induced donor concentration between d11 and d12 and with a medium proton-induced donor concentration higher than the low proton-induced donor concentration and lower than the high proton-induced donor concentration in the rest of the mesa areas 181. The electrochemical etching may be performed such that no Schottky depletion zone DZs is formed or, otherwise, by an anisotropic etch or an isotropic oxidation process may remove portions of the semiconductor structures 182 resulting from the Schottky depletion zones DZs.

Due to the self-adjusted formation of the semiconductor structure 182 the compensation structure 180 is perfectly compensated between the body zones 115 and the distance d11 as well as between d13 and the bottom plane BP as illustrated in the diagram on the left hand side of FIG. 2B showing the charge load and the electric field strength along the vertical direction. Thickness and vertical extension of bulges 411 between d11 and d12 define place and amplitude of a local p-load and notches 419 define place and amplitude of a local n-load of the compensation structure 180.

As further shown in the diagrams on the left hand side of FIG. 2B the electric field strength is constant where the load is balanced and has a shallow peak around d12 where the charge load changes its sign. The location of the peak determines the section of the semiconductor portion 100 where charge carriers are mainly generated in case of an avalanche event. Since the electric field strength decreases in both vertical directions from the place of generation, the avalanche can be spatially restricted to some extend such that avalanche ruggedness is improved.

FIG. 2C shows a super junction semiconductor device 500 whose vertical semiconductor structures 182 includes vertically arranged half-bubbles 411a and a connection portion connecting the half-bubbles 411a with each other and to an applied potential such that the half-bubbles 411a do not float. A ratio of the lateral width Δ1 of the connecting portions to a lateral width Δ2 of the half-bubbles 411a is greater 0 and may be less than 20%, e.g., at most 10%.

Figure 3B:
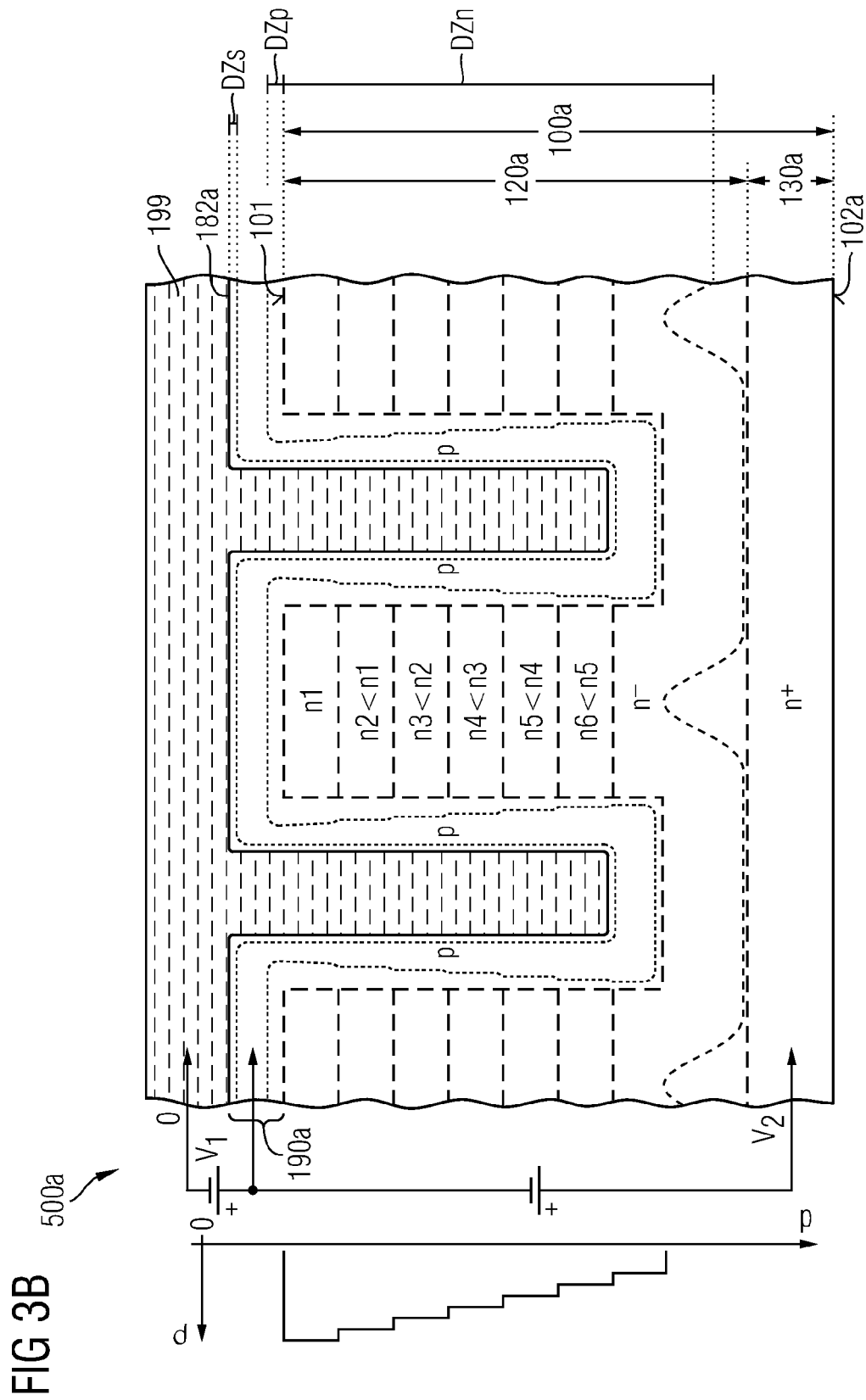
FIG. 3B is a schematic cross-sectional view of the semiconductor substrate portion of FIG. 3A at the beginning of the electrochemical etching.

FIGS. 3A to 3C refer to modifications of the method as described in detail with reference to FIGS. 1A to 1D. The following description discusses details of the modifications. For further details reference is made to the description of FIGS. 1A to 1D.

Before the electrochemical etching protons may be implanted at different implantation energies and implant doses. A thermal treatment activates the implanted protons in the mesas 161 as donors and provides a proton-induced donor concentration profile as depicted in the diagram on the left hand side of FIG. 3A. After the thermal treatment a mean proton-induced donor concentration n1 in first impurity zones 401 in the mesas 161 between the process surface 101a and d21 is greater than a mean proton-induced donor concentration n2 in a second impurity zone 402 between d21 and d22. The mean proton-induced donor concentration n2 in the second impurity zone 402 is higher than a mean proton-induced donor concentration n3 in a third impurity zone 403 between d22 and d23. The mean proton-induced donor concentration n3 in the third impurity zone 403 is higher than a mean proton-induced donor concentration n4 in a fourth impurity zone 404. The mean proton-induced donor concentration n4 in the fourth impurity zone 404 is higher than a mean proton-induced donor concentration n5 in a fifth impurity zone n5. The mean proton-induced donor concentration in the fifth impurity zone 405 is higher than a mean proton-induced donor concentration n6 in a sixth impurity zone 406.

Within each impurity zone 401-406 the vertical proton-induced donor concentration profile may be more or less constant or may have a more or less pronounced peak. The mean proton-induced donor concentration decreases more or less strictly between the process surface 101a and the bottom plane BP.

The protons may be implanted before or after forming the semiconductor layer 190a that lines at least sidewalls of the mesas 161. According to an embodiment, the protons are implanted after forming the semiconductor layer 190a for reducing fluctuations in the temperature budget applied after the proton implant.

P-type impurities may be implanted into horizontal portions of the semiconductor layer 190a outside the trenches 162 to form heavily doped contact regions 190x directly adjoining the mesas 161.

An etching solution 199, which is an alkaline solution, is brought into contact with the semiconductor layer 190a and voltages $V_1, V_2$ are applied between the pedestal layer 130a, the semiconductor layer 190a, and the etching solution 199, respectively as described with reference to FIG. 1B.

The dotted lines within the semiconductor layer 190a show the extension of the second portion DZp of the pn junction depletion zone as well as the extension of the Schottky depletion zone DZs. The first portion DZn of the pn junction depletion zone may almost completely deplete the main epitaxial layer 120a as shown by the dotted line above the pedestal layer 130 giving the extension of the first portion DZn of the pn junction depletion zone. Since the extension of the second portion DZp increases with increasing impurity concentration in the neighboring n-type region, DZp is the wider the higher the proton-induced donor impurity concentration in the neighboring section of the adjacent mesa 161 is.

The etching solution 199 isotropically recesses the material of the semiconductor layer 190a until the depletion DZp merges with the Schottky depletion zone DZs.

The etching solution 199 is removed. Horizontal portions of the semiconductor layer 190a on the process surface 101a and at the trench bottom may be removed. A further thermal treatment may deactivate, e.g., remove or anneal-out the proton-induced donors.

FIG. 3C shows semiconductor structures 182 formed by temporary proton implants in the mesas 161 and by electrochemical etching of the semiconductor layer 190a. Via the modulation of the width of the depletion zone in the semiconductor layer 190a through the implanted protons, the thickness of the semiconductor structures 182 is modulated and may more or less strictly decrease from the process surface 101a to the bottom plane BP.

Figure 4:
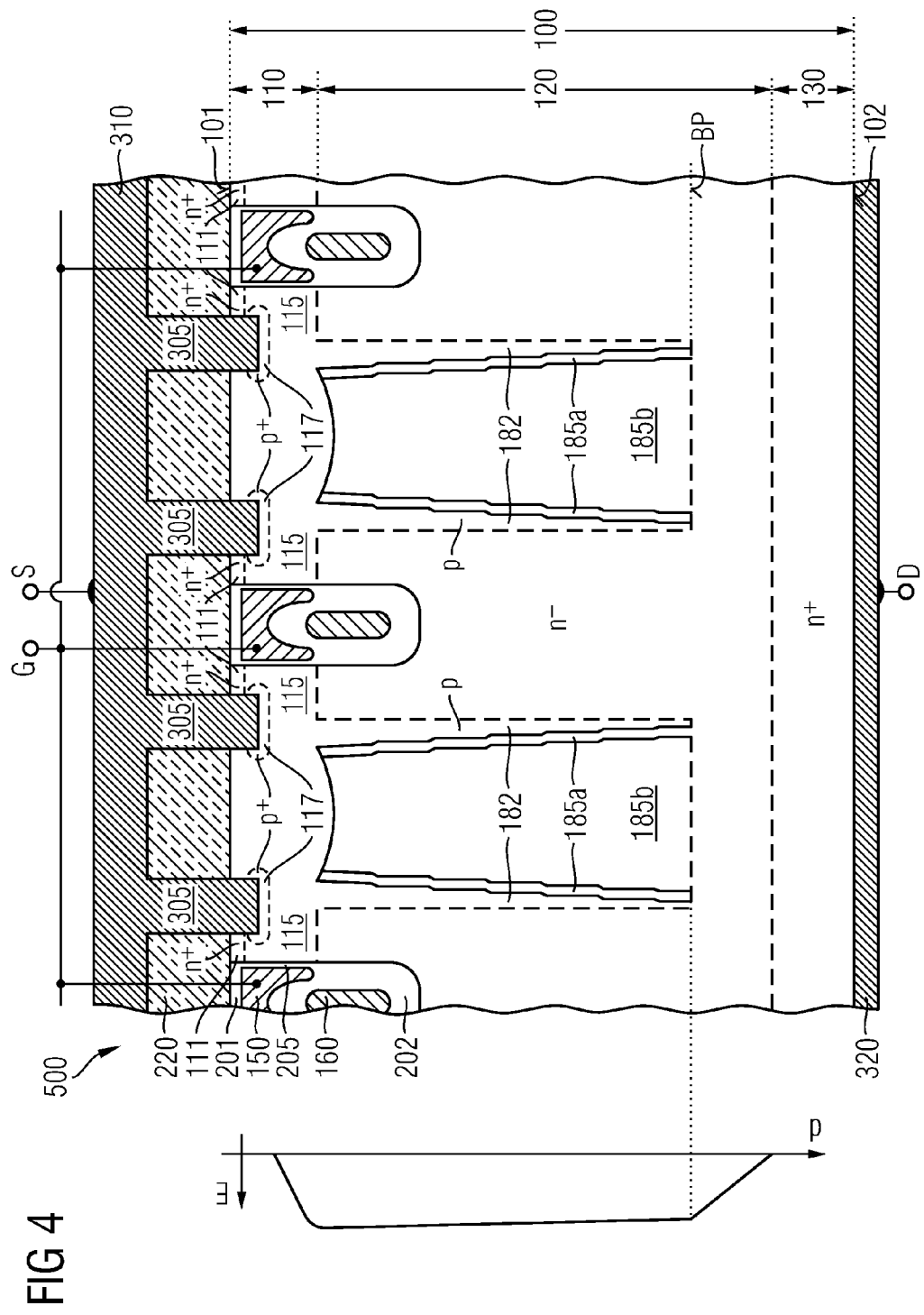
FIG. 4 is a schematic cross-sectional view of a portion of a SJ (super junction) semiconductor device in accordance with an embodiment providing a vertical semiconductor structure whose thickness decreases with increasing distance to a first surface.

FIG. 4 shows a super junction semiconductor device 500 which may result from the method as illustrated in FIGS. 3A to 3C. The semiconductor device 500 is or includes a super junction field effect transistor which differs from the semiconductor device 500 of FIG. 2A as regards the modulation of the thickness of the semiconductor structure 182. As regards the further features, reference is made to the detailed description in FIGS. 2A and 2B.

The thickness of the semiconductor structures 182 decreases more or less in steps with increasing distance to the first surface 101. Apart from the thickness variation induced by implanted protons before the electrochemical etching, the p-type impurities in the semiconductor structures 182 perfectly compensate the n-type impurities in the mesas 161. The proton-induced donors provide a detuning of the compensation wherein the detuning is well-defined both with respect to the location and to the amplitude.

The diagram on the left hand side of FIG. 4 shows the electric field strength between the first and the second surfaces 101, 102 as a function of the distance d to the first surface 101. Such a doping profile and vertical distribution of the electrical field can result in an enhanced avalanche and short-circuit ruggedness due to an effective compensation of the electron flow by the resulting stationary fixed space charge.

Figure 5:
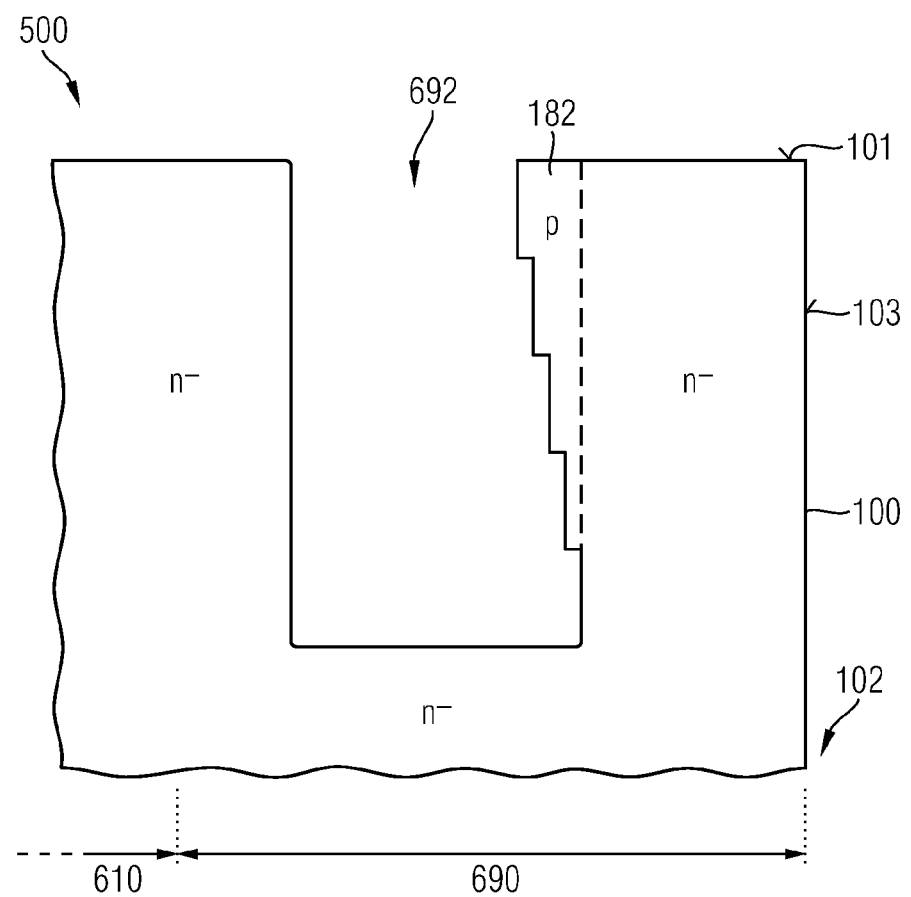
FIG. 5 is a schematic cross-sectional view of a portion of a semiconductor device in accordance with an embodiment providing a termination trench with a vertically patterned semiconductor structure.

FIG. 5 refers to an edge termination construction of a semiconductor device 500. The semiconductor device 500 includes an edge region 690 directly adjoining an outer surface 103 tilted, e.g. perpendicular, to the first surface 101 and connecting the first and second surfaces 101, 102 of a semiconductor portion 100 of the semiconductor device 500. The edge region 690 surrounds an active region 610 in the lateral directions, wherein the active region 610 may include, by way of example, transistor cells, diodes, logic circuits or analogue circuits.

In the edge region 690 one or more termination trenches 692 extend from the first surface 101 into the semiconductor portion 100. According to an embodiment one circumferential termination trench 692 surrounds the active area 610. According to other embodiments, a plurality of termination trenches 692 is arranged along a line surrounding the active region 610. Other embodiments may provide two or more concentric termination trenches 692.

Portions of the edge region 690 outside the termination trench 692 may be intrinsic or may have an n-type background impurity concentration. At least one of the sidewalls of the termination trench 692 includes a p-type semiconductor structure 182. The thickness of the semiconductor structure 182 is not uniform. According to an embodiment, the thickness of the semiconductor structure 182 increases or decreases with increasing distance to the first surface 101. According to other embodiments, the thickness of the semiconductor structure 182 may have one or more local maximum or minimum values. The thickness modulation of the semiconductor structure 182 modulates the electric field in the edge region 690 similar to a VLD (variation-of-lateral doping) concept. In contrast to VLD the present variation of doping is realized in the vertical direction resulting in a decrease of the maximum electrical field strength in the region of the junction termination.

Figure 6:
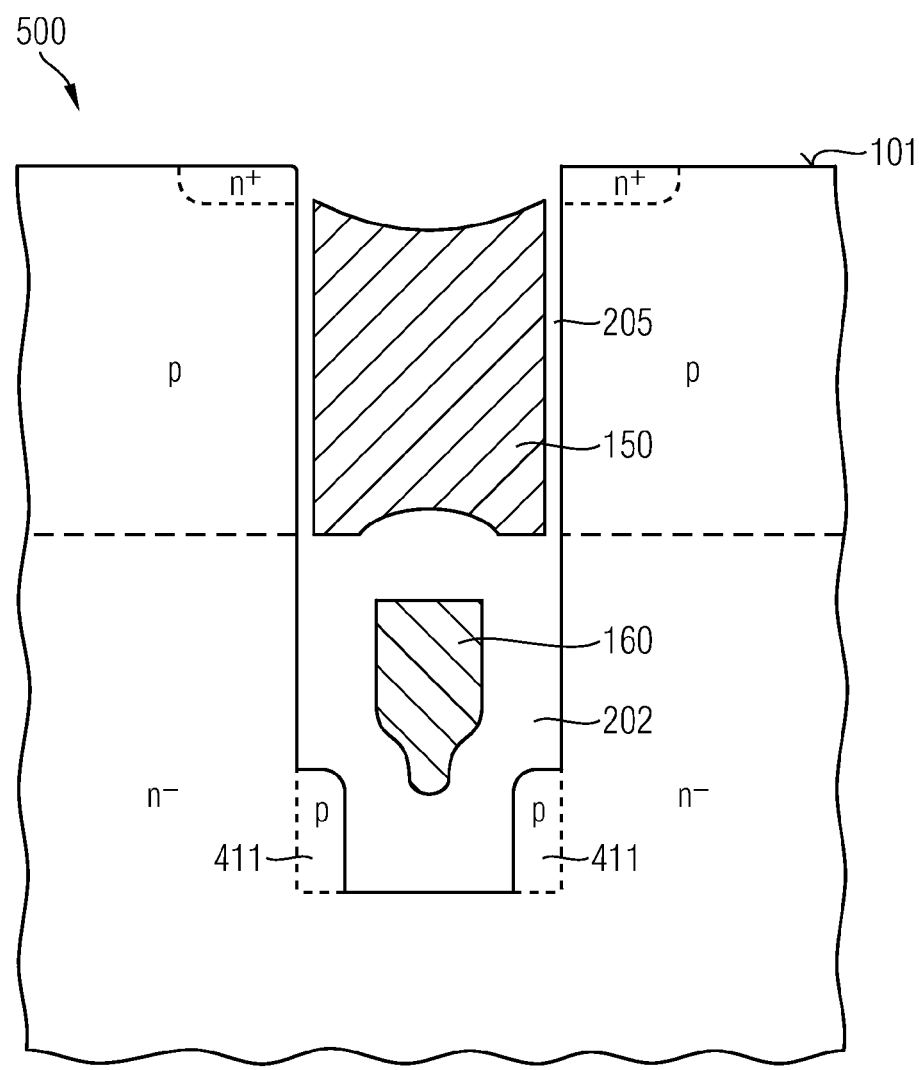
FIG. 6 is a schematic cross-sectional view of a portion of a semiconductor device in accordance with an embodiment providing vertical field plate IGFET (insulated gate field effect transistor) cells with field adjustment regions.

During manufacture of the semiconductor device 500 of FIG. 6 a gate trench is formed in a semiconductor substrate, wherein the gate trench extends from a process surface into the semiconductor portion. Protons are implanted into mesas adjoining the gate trench and close to a gate bottom plane. The thickness of a p-type semiconductor layer formed in the gate trench by a deposition technique or by diffusion of p-type impurities into sidewalls of the mesas is modulated according to the above described methods. An anisotropic etch or an oxidation process may isotropically recess the semiconductor layer such that the semiconductor layer is removed outside the bulges 411. Then a field dielectric 202 dielectrically insulating a conductive field electrode 160 is formed in a lower portion of the gate trench. A gate electrode 150 and a gate dielectric 205 dielectrically separating the gate electrode 150 from the semiconductor portion 100 is formed in an upper portion of the gate trench. In the adjoining mesas n-type source zones 111 are formed directly adjoining the gate trench as well as p-type body regions 115 separating the source regions 111 and a weakly doped drift zone 120 in the mesas.

The recessed bulges 411 of the semiconductor layer form pockets with p-type impurities along vertical sections of the gate trench structure and accommodate electric field peaks close to the gate trench bottom. Other than doped regions formed by implantation of donors through the gate trench bottom, the recessed bulges 411 do not or only to a low degree adversely affect the voltage blocking capabilities.

Figure 7:
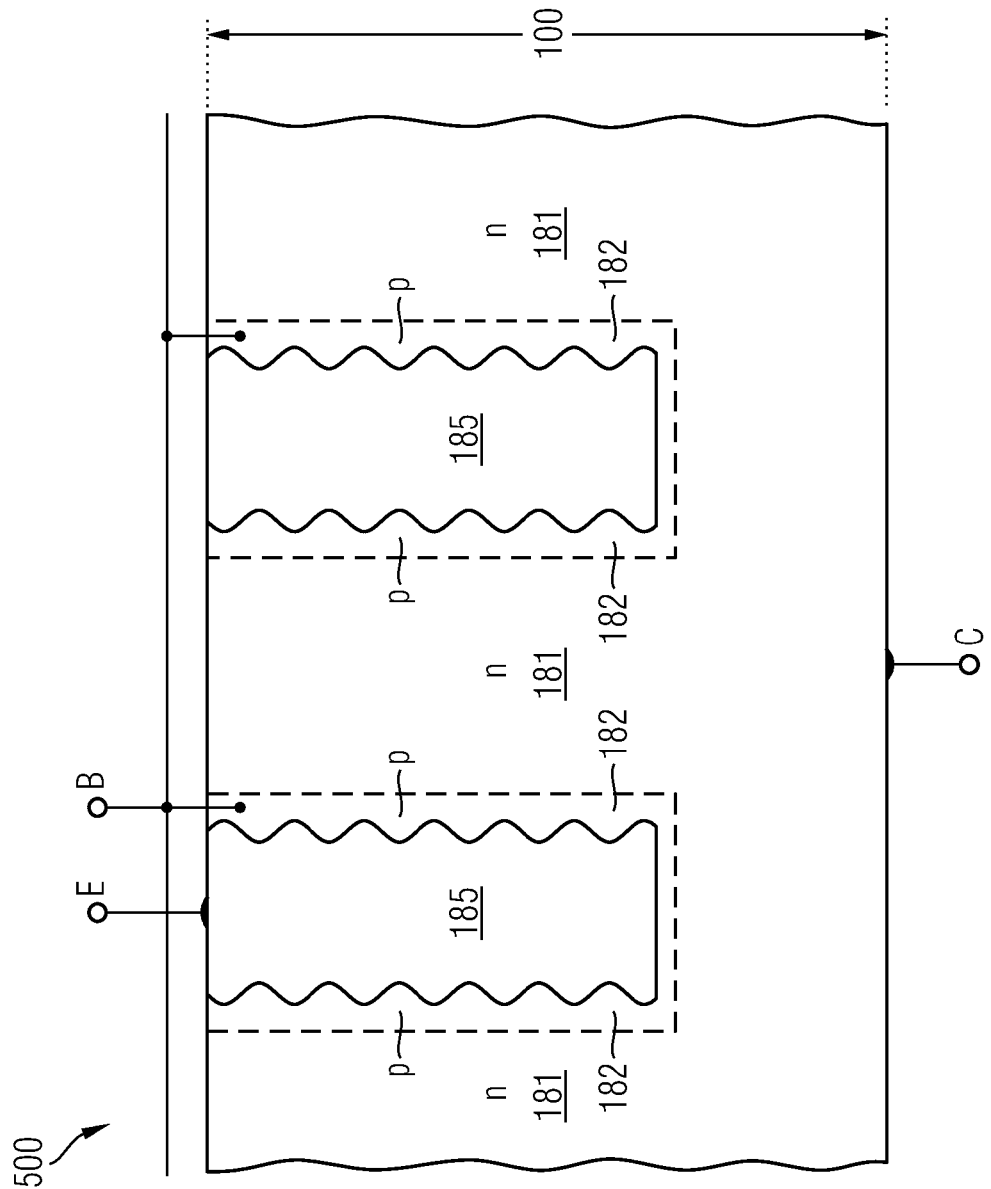
FIG. 7 is a schematic cross-sectional view of a portion of a semiconductor device in accordance with an embodiment providing a vertical semiconductor structure with a plurality of bulges and notches.

FIG. 7 refers to an embodiment where a plurality of bulges 411 and notches 419 in a semiconductor structure 182 increase an interface area between a pair of semiconductor structures 182 on the one hand and a fill structure 185 between the pair of semiconductor structures 182 on the other hand. According to an embodiment, the semiconductor layer 182 may form part of a base region of a BJT (bipolar junction transistor) and the fill structure 185 forms part of an emitter region of the BJT. The increased interface area may increase the gain of the BJT without increasing the lateral footprint.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   semiconductor mesas of a first conductivity type extending between a first surface and a bottom plane of a semiconductor portion; and
   a semiconductor structure of a second, complementary conductivity type extending along sidewalls of the semiconductor mesas and outwardly from the semiconductor mesas,
   wherein a thickness of the semiconductor structure has a local maximum value at a first distance to both the first surface and the bottom plane.

2. The semiconductor device of claim 1, wherein the thickness of the semiconductor structure has more than one local maximum along the respective sidewall of the semiconductor mesas.

3. The semiconductor device of claim 1, wherein two semiconductor structures extend on opposite sidewalls of neighboring ones of the semiconductor mesas.

4. The semiconductor device of claim 1, wherein the sidewalls of the semiconductor mesas are vertical to the first surface.

5. The semiconductor device of claim 1, wherein a vertical impurity concentration profile in the semiconductor portion has a local maximum at the first distance to the first surface.

6. A super junction semiconductor device, comprising:
   a semiconductor portion comprising a subsurface structure extending from a first surface of the semiconductor portion between mesas down to a bottom plane,
   wherein the mesas have a first conductivity type and the subsurface structure comprises semiconductor structures of a second, complementary conductivity type extending along sidewalls of the mesas and outwardly from the mesas,
   wherein a thickness of the semiconductor structures has a local maximum at a first distance to the first surface, the first distance being smaller than a main distance between the first surface and the bottom plane.

7. The super junction semiconductor device of claim 6, wherein the subsurface structure includes a fill structure of a filling material separating the semiconductor structures of the subsurface structure, the filling material being at least one of an intrinsic and a lightly doped semiconductor material and a dielectric material.

8. The super junction semiconductor device of claim 6, wherein the subsurface structure comprises a void.

9. The super junction semiconductor device of claim 6, wherein the super junction semiconductor device is a vertical insulated gate field effect transistor including a first load electrode and a control terminal at a first side of the semiconductor portion and a second load electrode at a second side of the semiconductor portion opposite the first side.

* * * * *